United States Patent
Fornasier et al.

(10) Patent No.: US 11,256,412 B2
(45) Date of Patent: Feb. 22, 2022

(54) INTERACTIVE TOUCH DISPLAY ASSEMBLY INCLUDING A DISPLAY STACK WITH A MULTI-LAYER CAPACITIVE KEYBOARD OVERLAID ON A 7-SEGMENT DISPLAY

(71) Applicant: Dixell S.r.l., Alpago (IT)

(72) Inventors: Redi Fornasier, Sedico (IT); Dino D'Inca, Belluno (IT); Manlio Poto, Belluno (IT); Marcello Venier, Pordenone (IT); Sandra Tome, Alpago (IT); Enrico Del Bene, Belluno (IT)

(73) Assignee: Dixell S.r.l., Alpago (IT)

( * ) Notice: Subject to any disclaimer, the term of this patent is extended or adjusted under 35 U.S.C. 154(b) by 0 days.

(21) Appl. No.: 16/294,614

(22) Filed: Mar. 6, 2019

(65) Prior Publication Data

US 2019/0278473 A1 Sep. 12, 2019

Related U.S. Application Data

(60) Provisional application No. 62/640,963, filed on Mar. 9, 2018.

(51) Int. Cl.
*G06F 3/0488* (2013.01)
*G06F 3/04883* (2022.01)
(Continued)

(52) U.S. Cl.
CPC .......... *G06F 3/04883* (2013.01); *G06F 3/044* (2013.01); *G06F 3/0412* (2013.01);
(Continued)

(58) Field of Classification Search
None
See application file for complete search history.

(56) References Cited

U.S. PATENT DOCUMENTS 7,339,580 B2 3/2008 Westerman et al.
7,487,461 B2 2/2009 Zhai et al.
(Continued)

FOREIGN PATENT DOCUMENTS

CN 104484080 A 4/2015
CN 104484083 A 4/2015
(Continued)

OTHER PUBLICATIONS

International Search Report regarding International Application No. PCT/IB2019/051917, dated May 20, 2019.
(Continued)

*Primary Examiner* — Benjamin X Casarez
(74) *Attorney, Agent, or Firm* — Harness, Dickey & Pierce, P.L.C.

(57) ABSTRACT

An interactive touch display assembly is provided and includes a circuit board and a user interface. The circuit board includes a first control module. The user interface includes a 7-segment display and a first capacitive keyboard. The 7-segment display is connected to the circuit board. The first capacitive keyboard is overlaid on at least a portion of the 7-segment display and includes a capacitive sensing layer having capacitive sensing elements. States of the capacitive sensing elements changes based on gestures provided by a user of the interactive touch display assembly. The first control module is configured to control operation of the 7-segment display based on detected changes in the states of the capacitive sensing elements.

33 Claims, 17 Drawing Sheets

(51) Int. Cl.
  *G06F 3/041* (2006.01)
  *G06F 3/04817* (2022.01)
  *G06F 3/04845* (2022.01)
  *G09F 9/302* (2006.01)
  *G06F 3/044* (2006.01)
  *H03K 17/96* (2006.01)

(52) U.S. Cl.
  CPC ........ *G06F 3/0416* (2013.01); *G06F 3/04817* (2013.01); *G06F 3/04845* (2013.01); *G09F 9/302* (2013.01); *H03K 17/9622* (2013.01); *G06F 2203/04103* (2013.01); *H03K 2217/960755* (2013.01); *H03K 2217/960785* (2013.01)

(56) References Cited

U.S. PATENT DOCUMENTS

| | | | |
|---|---|---|---|
| 8,878,810 | B2 | 11/2014 | Ludwig |
| 2007/0176867 | A1* | 8/2007 | Reggiardo ....... G01N 33/48785 345/87 |
| 2008/0204428 | A1* | 8/2008 | Pierce ................ G06F 3/0202 345/174 |
| 2009/0090605 | A1 | 4/2009 | Arione et al. |
| 2012/0283894 | A1* | 11/2012 | Naboulsi ............ B60R 11/0264 701/1 |
| 2013/0082948 | A1* | 4/2013 | Ok ..................... F25D 29/00 345/173 |
| 2014/0016046 | A1 | 1/2014 | Zarcone |
| 2014/0181758 | A1* | 6/2014 | Pasquero ........... G06F 3/04883 715/863 |
| 2014/0192013 | A1* | 7/2014 | Lubert ................ D06F 39/005 345/174 |
| 2014/0267138 | A1* | 9/2014 | Curtis ................. G06F 3/0488 345/174 |
| 2015/0091855 | A1* | 4/2015 | Chen .................. G06F 3/044 345/174 |
| 2015/0160850 | A1 | 6/2015 | Krause |
| 2015/0301663 | A1 | 10/2015 | Curtis |
| 2016/0011687 | A1 | 1/2016 | Ding et al. |
| 2016/0178276 | A1* | 6/2016 | Park .................... F25D 29/005 345/173 |
| 2017/0160835 | A1 | 6/2017 | Zenker et al. |
| 2017/0336904 | A1* | 11/2017 | Hsieh ................. G06F 3/033 |
| 2019/0063722 | A1* | 2/2019 | Sugiyama ........... B60K 37/06 |
| 2020/0007127 | A1* | 1/2020 | Bellm ................ G06F 3/044 |

FOREIGN PATENT DOCUMENTS

| | | |
|---|---|---|
| CN | 204437835 U | 7/2015 |
| CN | 204537087 U | 8/2015 |
| CN | 204631829 U | 9/2015 |
| CN | 204706296 U | 10/2015 |
| CN | 105068689 A | 11/2015 |
| CN | 105070215 A | 11/2015 |
| CN | 204790942 U | 11/2015 |
| CN | 105135494 A | 12/2015 |
| CN | 204833202 U | 12/2015 |
| EP | 2556778 A1 | 2/2013 |
| EP | 2674834 A2 | 12/2013 |
| WO | WO-2014126661 A1 | 8/2014 |
| WO | WO-2016045121 A1 | 3/2016 |

OTHER PUBLICATIONS

Written Opinion of the International Searching Authority regarding International Application No. PCT/IB2019/051917, dated May 20, 2019.

* cited by examiner

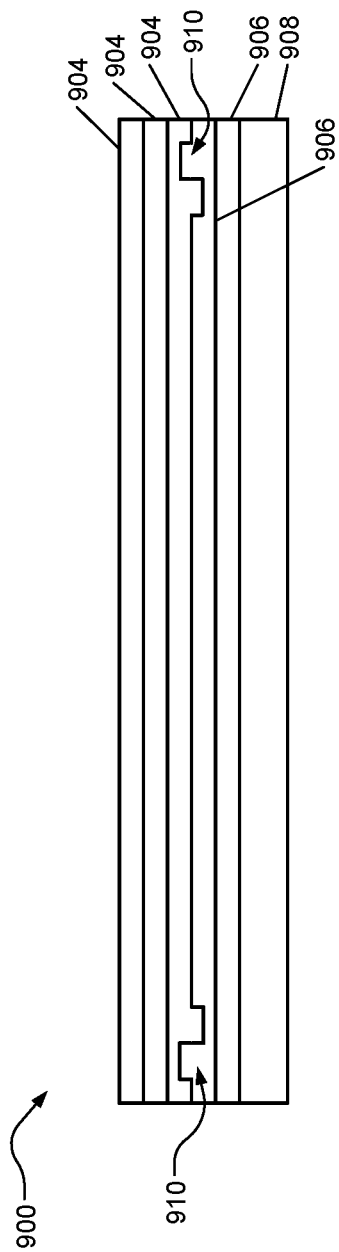

INTERACTIVE TOUCH DISPLAY ASSEMBLY INCLUDING A DISPLAY STACK WITH A MULTI-LAYER CAPACITIVE KEYBOARD OVERLAID ON A 7-SEGMENT DISPLAY

CROSS-REFERENCE TO RELATED APPLICATIONS

This application claims the benefit of U.S. Provisional Application No. 62/640,963, filed on Mar. 9, 2018. The entire disclosures of the applications referenced above are incorporated herein by reference.

FIELD

The present disclosure relates to interactive displays.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Mobile electronic devices and other consumer electronic devices (collectively referred to herein as "network devices") may include user interfaces with capacitive keyboards and graphic displays. Some of the network devices allow users to interact with the network devices via virtual keyboards or simple touch gestures. Thus, it is becoming unnecessary for a network device to include a mechanical keyboard.

In domestic and commercial markets a lack of a mechanical keyboard is well established. For example, electronic thermostats, smart watches and mobile phones and tablets exist that include capacitive keyboards and graphic displays and do not include a mechanical keyboard. In industrial markets, however, mainly due to cost reduction efforts, there are still low-cost solutions implemented including user interfaces that each have (i) a 7-segment light emitting diode (LED) display or a 7-segment liquid crystal display (LCD), and (ii) a mechanical keyboard.

SUMMARY

An interactive touch display assembly is provided and includes a circuit board and a user interface. The circuit board includes a first control module. The user interface includes a 7-segment display and a first capacitive keyboard. The 7-segment display is connected to the circuit board. The first capacitive keyboard is overlaid on at least a portion of the 7-segment display and includes a capacitive sensing layer having capacitive sensing elements. States of the capacitive sensing elements changes based on gestures provided by a user of the interactive touch display assembly. The first control module is configured to control operation of the 7-segment display based on detected changes in the states of the capacitive sensing elements.

In other features, the 7-segment display includes a 7-segment LED display or a 7-segment LCD. In other features, the 7-segment display includes 7-segment LED devices or 7-segment LCD devices. In other features, the interactive touch display assembly further includes a second capacitive keyboard overlaid on a second portion of the 7-segment display.

In other features, the first capacitive keyboard includes one or more decoration film layers or light guide layers. The one or more decoration film layers or light guide layers are overlaid on the capacitive sensing layer.

In other features, the first capacitive keyboard covers some of the 7-segment display. In other features, the first capacitive keyboard covers all the 7-segment display. In other features, an entire interactive area of the user interface is a same amount of area that the first capacitive keyboard covers on the 7-segment display. In other features, the first control module is configured to classify interactions with the user based on the gestures detected via the first capacitive keyboard.

In other features, the 7-segment display and the first capacitive keyboard are configured to display the screens. Each of the screens corresponds to a respective one or more functions performed by the interactive touch display assembly. In other features, each of the screens includes displays a subset of available segments and a subset of available icons. In other features, the icons are notification or function identification icons.

In other features, the first capacitive keyboard includes light guides for guiding light generated by the 7-segment display. In other features, the capacitive sensing elements of the first capacitive keyboard are not associated with predefined functions. In other features, the gestures include: a single touch in any area of a surface of the user interface; multiple touches in different areas of the surface of the user interface; a horizontal swipe on the surface of the user interface; a vertical swipe on the surface of the user interface; a clockwise rotational swipe on the surface of the user interface; and a counterclockwise rotational swipe on the surface of the user interface.

In other features, the first capacitive keyboard covers the 7-segment display and includes layers. At least a portion of each of the layers is transparent. Segments illuminated on the 7-segment display are visible through the first capacitive keyboard.

In other features, the interactive touch display assembly further includes a casing or a container. The first capacitive keyboard is attached to an inner side of the casing or the container.

In other features, a front surface of the casing or the container is transparent. In other features, the 7-segment display is configured to connect to the circuit board via a first connector. The first capacitive keyboard includes a ribbon circuit. The ribbon circuit is configured to connect to the circuit board via a second connector.

In other features, the first capacitive keyboard includes a decoration film layer. The decoration film layer includes light guides. The 7-segment display is configured to light-up selected ones of the light guides to display a predetermined set of segments and one or more icons. The predetermined set of segments includes one or more segments.

In other features, a network device is provided and includes the interactive touch display assembly, a second control module and a power source. The second control module connected to the first control module. The power source is configured to provide power to the first control module and the second control module.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 20 is a side cross-sectional view of an example of a capacitive keyboard including a stack of layers in accordance with an embodiment of the present disclosure.

In the drawings, reference numbers may be reused to identify similar and/or identical elements.

DETAILED DESCRIPTION

Figure 1:
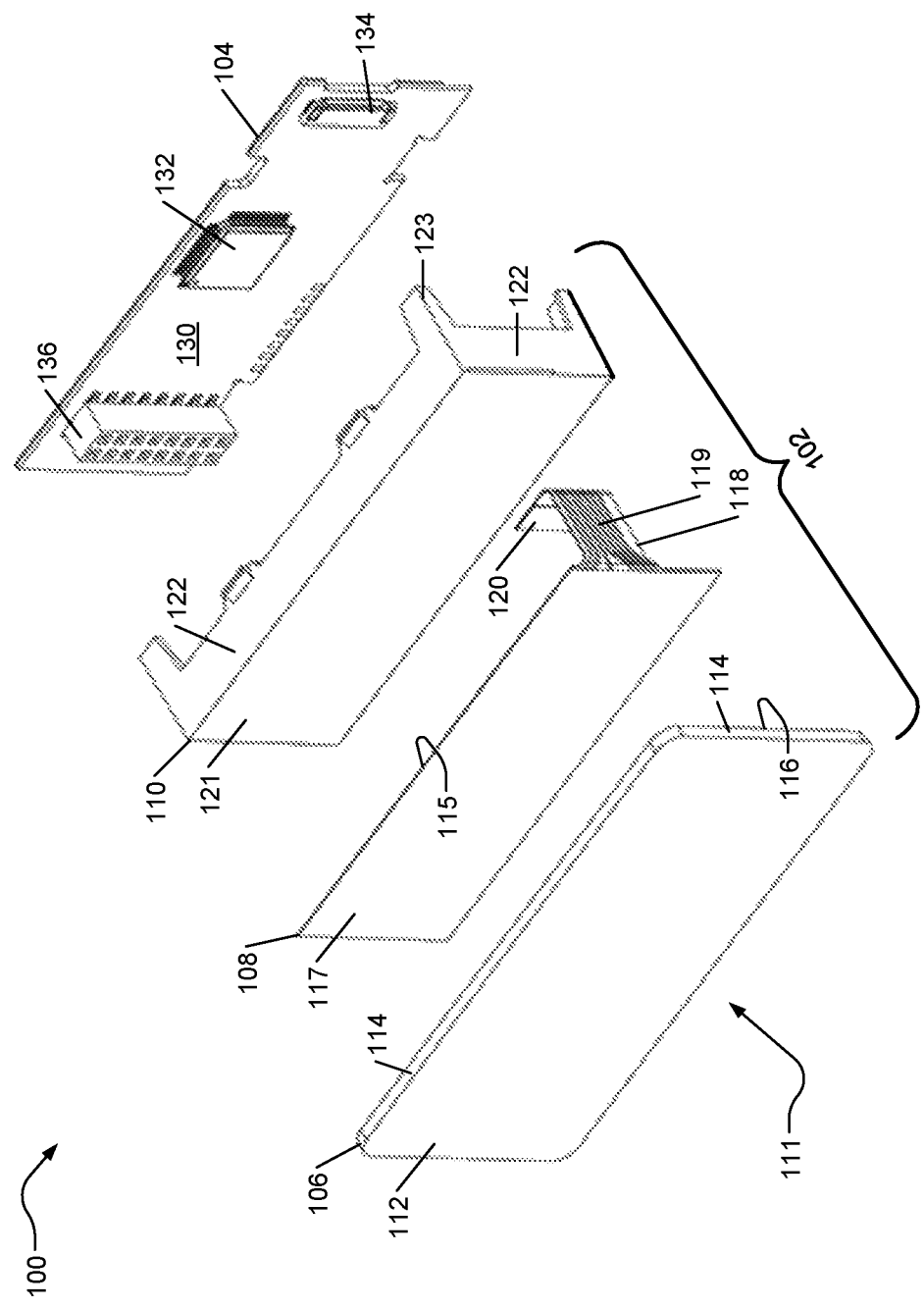
FIG. 1 is a perspective exploded view of an example of an interactive touch display assembly including a 7-segment display and a capacitive keyboard in accordance with an embodiment of the present disclosure.

A fundamental characteristic of each network device is the ability to interact with an external user via a user interface (referred to sometimes as a "man-to-machine user interface (M2MUI)). The interaction between a user and a network device includes a physical aspect, a mechanical aspect and a logic aspect, which translate user actions into specific machine commands. The user interface typically includes: a display used to transfer visual information to the user; and a keyboard to receive commands from the user. The keyboard, when in the form of a capacitive keyboard, may be in different configurations relative to the display. As a few examples, the keyboard, when viewing a front side of the display, may be located on a side of the display, below or above the display, or around the display depending on, for example, the type and/or makeup of the display. In these configurations, one of the most stringent constructive constraints is characterized by the space available for positioning the keyboard and the display within a corresponding open area of a housing of the network device. There are various format standards available for panel electronic devices and electrical panels. A couple of examples of which are the 32×74 Deutsche Institute for Normung (DIN) format standard and the 72×72 DIN format standard. Network devices configured to satisfy these format standards have a defined surface area available for a user interface. The limited surface available for implementation of the user interface places constraints on the design of the user interface. Thus, to maximize efficiency of a user interface, the user interface may be designed to have a maximum number of functions provided by a minimal number of keys. The versatility of the keyboard affects the number of functions that can be provided for a particular number of keys.

In addition, the number of functions that can be provided on a network device and made accessible and enabled by a user is ever increasing. As an example, a user may be provided with a function that allows the user to set a certain level of activation of an alarm threshold based on a parameter, where the parameter can have values selectable by the user from a predetermined set of values. To set the alarm threshold and/or the values at which an alarm is to be activated, the network device and corresponding user interface needs to perform a series of actions including receiving inputs from the user. Depending on the function being performed, the network device involved, and the user interface involved, the actions can be more or less simple and more or less intuitive. In general, a user interface should be designed to (i) minimize the number of actions needed to be performed by the user to activate and set the function, and (ii) to minimize the time needed for the user to activate and set the function. The user should be able to activate and set the function without aid of an instruction manual. Often when designing a user interface, the intuitiveness of operation is sacrificed due to other requirements, such as cost and/or other reasons related to the available space for the user interface. The available space for a user interface is typically the basis upon which design specifications are set. This includes determining a number of keys (or virtual keys) and a corresponding number of settings for functions to be available and setting corresponding parameters.

Furthermore, a user interface is often one of the elements of design and distinction between different network devices, especially between network devices that have similar functions. The ability to recognize a brand, for example, due to a corresponding product design is important in an ever growing market where numerous different network devices are available for a user to choose from.

Unlike the consumer electronics market, the industrial market includes network device solutions that have been used because of the costs of implementing new available technologies. An example of a solution that has been considered too costly is the use of a user interface with a graphic display and/or a capacitive keyboard. This has led to a clear segmentation of the types of user interfaces available and the corresponding methods of interaction. In recent decades, the technologies for user interfaces that have been consolidated are mainly the following types: A) user interfaces that each include (i) a 7-segment LED display or a 7-segment LCD display (hereinafter referred to as a "7-segment display"), and (ii) a mechanical keyboard, a membrane keyboard, a capacitive keyboard, or resistive keyboard; and B) user interfaces that each include (i) a graphic display (e.g., a thin film transistor (TFT) LCD or a TFT LED display) and a mechanical keyboard, a membrane keyboard, a capacitive keyboard, or a resistive keyboard.

The difference between the various solutions is mainly due to the kind of display used. The cheapest solution being a 7-segment display to the most expensive solution including a graphic display. The cost of a user interface often precludes the choice of a technology with a graphic display and a capacitive keyboard, in favor of a more economical solution with (i) a 7-segment display, and (ii) mechanical keyboard, a membrane keyboard, a capacitive keyboard, or a resistive keyboard. This leads to a limitation of a type and amount of information available and usable by the user. For example, the limited space associated with and the structure of a 7-segment display prevents displaying a set of complex information in a single screen. This is unlike a graphic display, which allows displaying a set of complex information in a single screen. Another advantage of using a graphic display with a capacitive keyboard or a resistive keyboard is that the graphic display provides an easy and intuitive interaction process between a user and a network device. Each function of the network device can be represented with a dedicated screen, where symbols, images and function keys are only the symbols, images and functions keys necessary for an easy and intuitive interaction process. Therefore, a graphic display with a capacitive keyboard or resistive keyboard provides a dynamic system of interaction and management of commands and information provided to and received from a user.

A 7-segment display with a separate mechanical keyboard, a membrane keyboard, a capacitive keyboard, or a resistive keyboard placed side-by-side with the 7-segment display provides a static system of interaction to manage commands and information provided to and received from a user. A subset of static information shown in the 7-segment display may be used to indicate, for example, that is active, the function parameter being changed, and the value of the function parameter being modified.

Another feature to consider when using a 7-segment display with one of the stated keyboards is the available user interface space due to the side-by-side relationship between the 7-segment display and the stated keyboards. The available user interface space may be divided between a first area used for geometric layout of keys and a second separate area used for the 7-segment display including 7-segment display devices. As a result, there is: a reduced possibility of interaction between a user and a network device, where a few buttons give access to a limited number of immediate functions, and where an immediate function means a simple action (for example, pressing a button) to activate a complex function; and a reduced size of the 7-segment display, which may cause a lack of intelligibility of information by a user. A 7-segment display may provide poor intuitiveness of operations of a corresponding network device relative to a graphics display. The intuitiveness may be further reduced by the small amount of space available to exchange and read the information.

A user interface including a 7-segment display and/or other static system of interaction for managing commands and information provided to and received from a user may have the following usage limitations: limited intuitiveness of use due to a reduced number of immediate access functions available; and a need to implement particular and complex procedures to activate particular commands and/or access particular functions. These static systems are not intuitive, dependent on a corresponding network device and can cause a user to access an operating manual of the network device. As an example, the procedures for entering a menu of parameters and/or alarm settings a password or with a combination of keys may not be intuitive and require a user to access an operating manual.

Another limitation associated with static systems includes not being able to use some functional indicators on 7-segment displays due to a reduced amount of available space and as a result having a need to use additional icons. A rational choice must be made to simplify amounts of additional information available on the 7-segment displays, for example using functional icons, to simplify associated reading by a user in the event of concomitance of several active functions.

Another limitation associated with static systems includes needing to manage different user interfaces, for the same network device, to make specific functions available or not. For example, an ON/OFF key may be used to provide a power-ON function or may be used for a different function. The power-ON function may be provided using a key other than the ON/OFF key. In a network device having a user interface with only a few functional keys, one or more of the keys are typically not deactivated because this would reduce the efficiency of the user interface.

For static systems, such as systems including a 7-segment display, a few example design options are: A) associating different functions to a single key (with special screen printing that reminds the user mnemonically of the usage (or current function) of the key), where the different functions can be activated by pressing the same key for a different amount of time (e.g., a first function may be activated by pressing the key for 1 second, a second function may be activated by pressing the key for 5 seconds, etc.); B) using key combinations to access menus and/or to activate/deactivate particular functions; and C) providing different user interfaces with different screen printing for enabled functions.

An increase in the number of codes of similar network devices of a company, where the network devices have different user interfaces, results in a lack of efficiency in a corresponding production structure for the network devices. In addition, more management time and resources are needed to track, identify, monitor, and maintain the codes and production structure.

The examples set forth herein include interactive touch display assemblies including a display stack with capacitive keyboards overlaid on 7-segment displays and corresponding 7-segment display devices, where the capacitive keyboards include one or more decoration film layers and a capacitive sensing layer. As a couple of examples, the 7-segment displays may be a 7-segment LED display or a 7-segment LCD. The examples include reliable structures that are not complex, are simple to use, increase possibility of user interaction and have minimal associated costs. The examples increase the amount of information available to a user and allow for standardization of user interfaces for a same product family.

Traditional network devices having 7-segment displays and capacitive keyboards are limited in that: a user can only interact with the network devices via a pre-defined two-dimensional interaction area (or space) on a user interface surface of a network device dictated by a non-modifiable geometric arrangement of keys; and predetermined functions associated with the two-dimensional interaction area and coinciding with positions of the keys (e.g., enabling and disabling a function by pressing a key). This means that the physical or mechanical keys coincide, in the two-dimensional interaction area of the user interface surface, with corresponding logic functions.

The disclosed examples include interactive touch display assemblies including overlaid configurations providing a user interactive experience that is different than traditional network devices having 7-segment displays and capacitive keyboards. The examples include overlaying a capacitive keyboard, with capacitive keys not associated with one or more predefined functions, on a 7-segment display. The paradigm of the "physical key associated with one or more predefined functions" is not provided and a different paradigm is provided, where functions are implemented via an interactive surface, and where keys of a capacitive keyboard assume different functions depending on the mode of use, the operation being performed, and the gesture being provided by a user. The examples allow a user to interact with network devices via gestures. The gestures may include, for example, touching and/or sliding of one or more fingers and/or objects on front interactive surfaces of the network devices. The network devices, are configured such that, by providing the gestures on the front surfaces, the gestures are provided over both capacitive keyboards and 7-segment displays of the network devices. The gestures may include various touch and/or slide patterns. Examples of the gestures are further described below with respect to at least FIGS. 12-14.

The disclosed examples include capacitive keyboards with a reduced number of capacitive sensors relative to traditional capacitive keyboards. The examples allow: a user to navigate through available information using virtual screens, which may have more complex views than traditional 7-segment displays; provide an extension of the interactive space used to exchange information, such that commands are provided over an entire surface of the user interface without losing (or not having) a space traditionally dedicated for a keyboard. The space is now shared for both displaying information and receiving user inputs. The examples further: overcome the physical/mechanical key paradigm associated with one or more predefined functions while eliminating and/or minimizing use of complex procedures for accessing and enabling functions by means of complex (or multi-step) key combinations and/or differentiated applied amounts of key pressure times.

The examples do not require: a large number of LED points to ensure good detail of shapes displayed and/or a complex and expensive LED driver. The examples are further able to be used in small electronic panel and/or electrical panel implementations having confined available spaces for displays.

Figure 2:
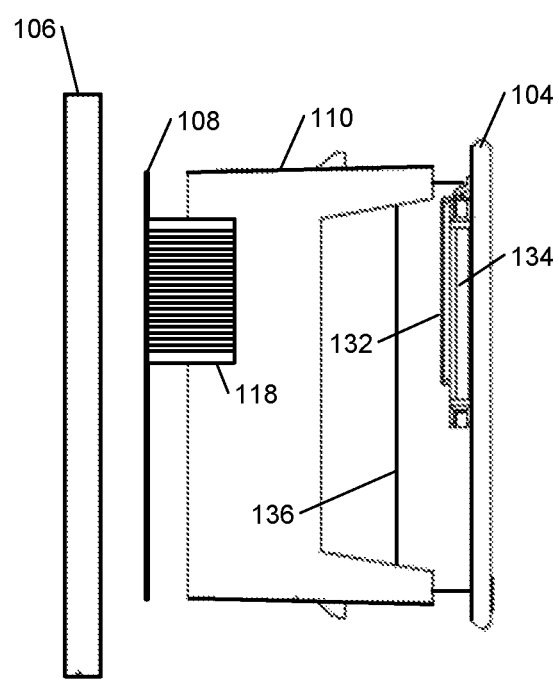
FIG. 2 is a side exploded view of the 7-segment display of FIG. 1.

FIGS. 1-2 show an example of an interactive touch display assembly 100 including a display stack 102 and a printed circuit board (PCB) 104. The display stack 102 includes a casing 106, one or more multi-layer capacitive keyboards (one multi-layer capacitive keyboard 108 is shown), and a 7-segment display 110. The casing 106, in addition to protecting the multi-layer capacitive keyboard 108, the 7-segment display 110, and/or the PCB 104, also provides an external surface of a user interface 111. In one embodiment, the casing 106 may be used to encase at least a portion of the multi-layer capacitive keyboard 108, as shown. In another embodiment, the casing 106 may be larger than shown and be configured to encase the multi-layer capacitive keyboard 108, the 7-segment display 110 and the PCB 104. In another embodiment, the casing 106, the capacitive keyboard 108 and the 7-segment display 110 are incorporated in a container. The casing 106 has a transparent front (or user interface) surface 112 and sides 114. The front surface 112 may be smooth and configured to receive user touches and gestures. The casing 106 may be formed of, for example, plastic, plastic polymers, and/or other suitable materials. In one embodiment, the casing 106 (or container) is not exclusively made up of plastic polymers. The multi-layer capacitive keyboard 108 may also or alternatively be applied to a front flat-transparent panel or front surface 121 of the 7-segment display 110.

The multi-layer capacitive keyboard 108 is disposed in the casing 106 and is overlaid on the 7-segment display 110. In one embodiment, the multi-layer capacitive keyboard 108 is applied with an adhesive to an inner side 116 of the casing 106. The multi-layer capacitive keyboard 108 may be adhered to the inner side 116 via a layer of adhesive material. In addition, a system of mechanical and/or pressure couplings and/or joints is included, such as that provided by applying a transparent plastic bracket and/or a light guide bracket against a back side 115 of the capacitive keyboard 108. In an embodiment, a bracket 123 of the 7-segment display 110 is used to apply pressure on the back side 115 and/or fasten the capacitive keyboard 108 to the casing 106. The transparent plastic bracket and/or light guide bracket may contact the back side 115 and be fastened to the casing 106. This may apply pressure directly on a portion of the capacitive keyboard 108 that is not in contact with the inner surface 116 of the casing 106 (or other implemented container) and in a direction towards the inner side 116 of the casing 106. This supports the multi-layer capacitive keyboard 108 in the casing 106.

The multi-layer capacitive keyboard 108 includes multiple layers (collectively designated 117), which are further shown and described with respect to FIGS. 3-7. The layers and/or portions of each of the layers may be transparent and include, for example, one or more decoration film layers, one or more light guide layers, and/or one or more capacitive sensing layers. The layers may be plastic polymer film layers. As an alternative to adhesively attaching one or more of the decoration film layers and/or one or more of the light guide layers to the inner side 116 of the casing 106, the decoration film layers and/or the light guide layers may interlock with each other and/or the inside of the casing 106. As an example, two adjacent layers may have portions that protrude towards and into areas of each other in such a manner that when in contact with each other the two adjacent layers interlock. As yet another alternative, the decoration film layers and/or the light guide layers may interlock between the casing 106 and the 7-segment display 110. Each of the layers may be formed of plastic polymer films and/or other suitable materials. The layers 117 of the multi-layer capacitive keyboard 108 may be connected to the PCB 104 via one or more connectors and/or welds. An example stack of the layers 117 is shown in FIG. 20. In an embodiment, the multi-layer capacitive keyboard 108 includes a ribbon circuit 118 with traces 119 and a connector 120.

Figure 6:
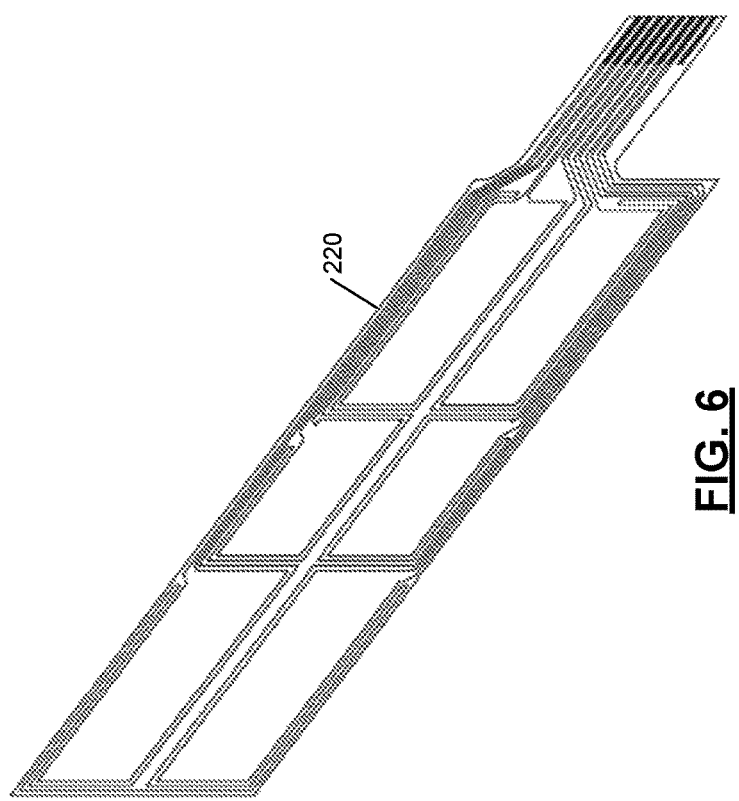
FIG. 6 is a perspective view of the capacitive sensing layer of FIG. 5.
Figure 18:
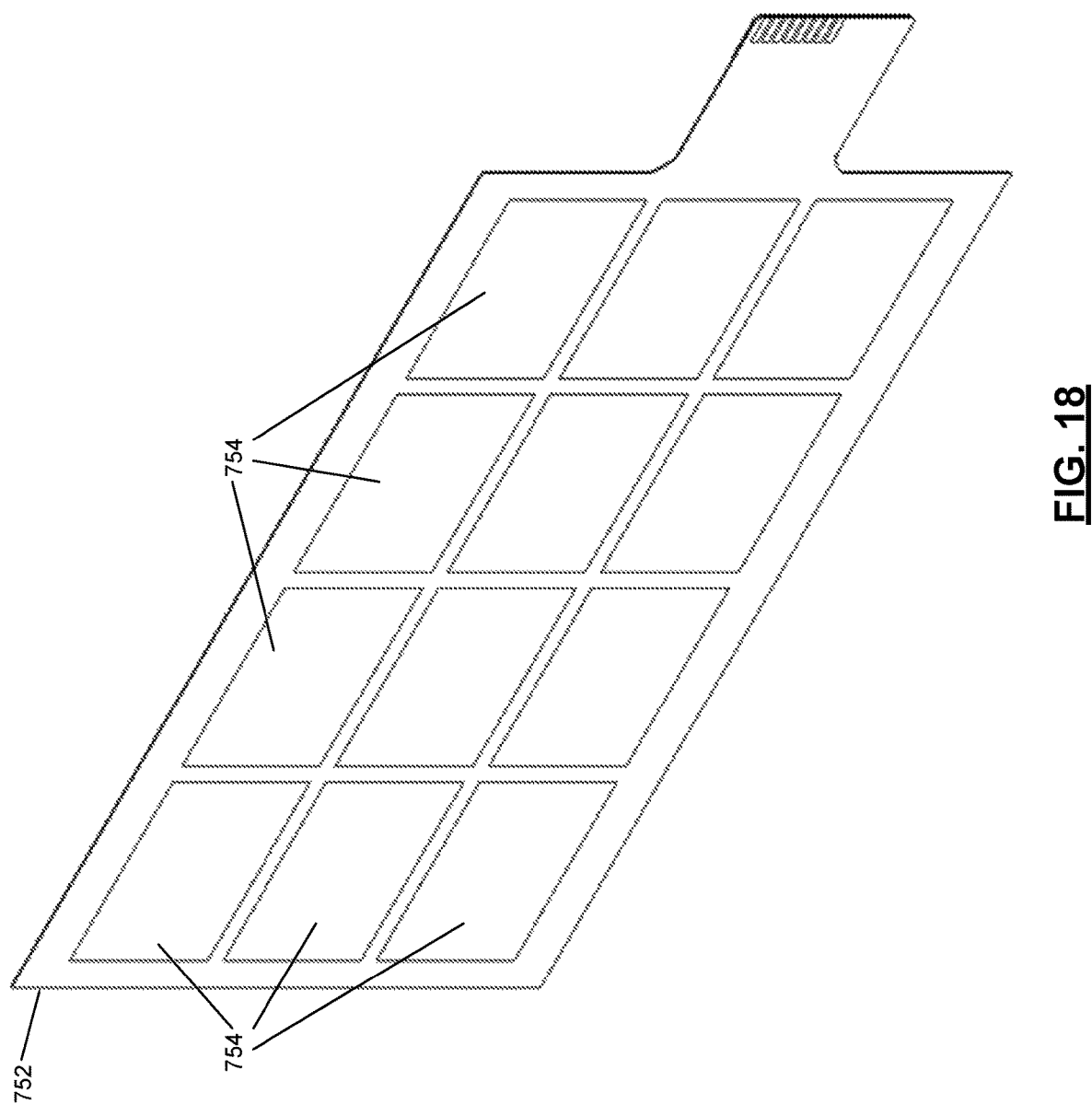
FIG. 18 is a perspective view of another capacitive keyboard including 12 sensing elements in accordance with an embodiment of the present disclosure.
Figure 19:
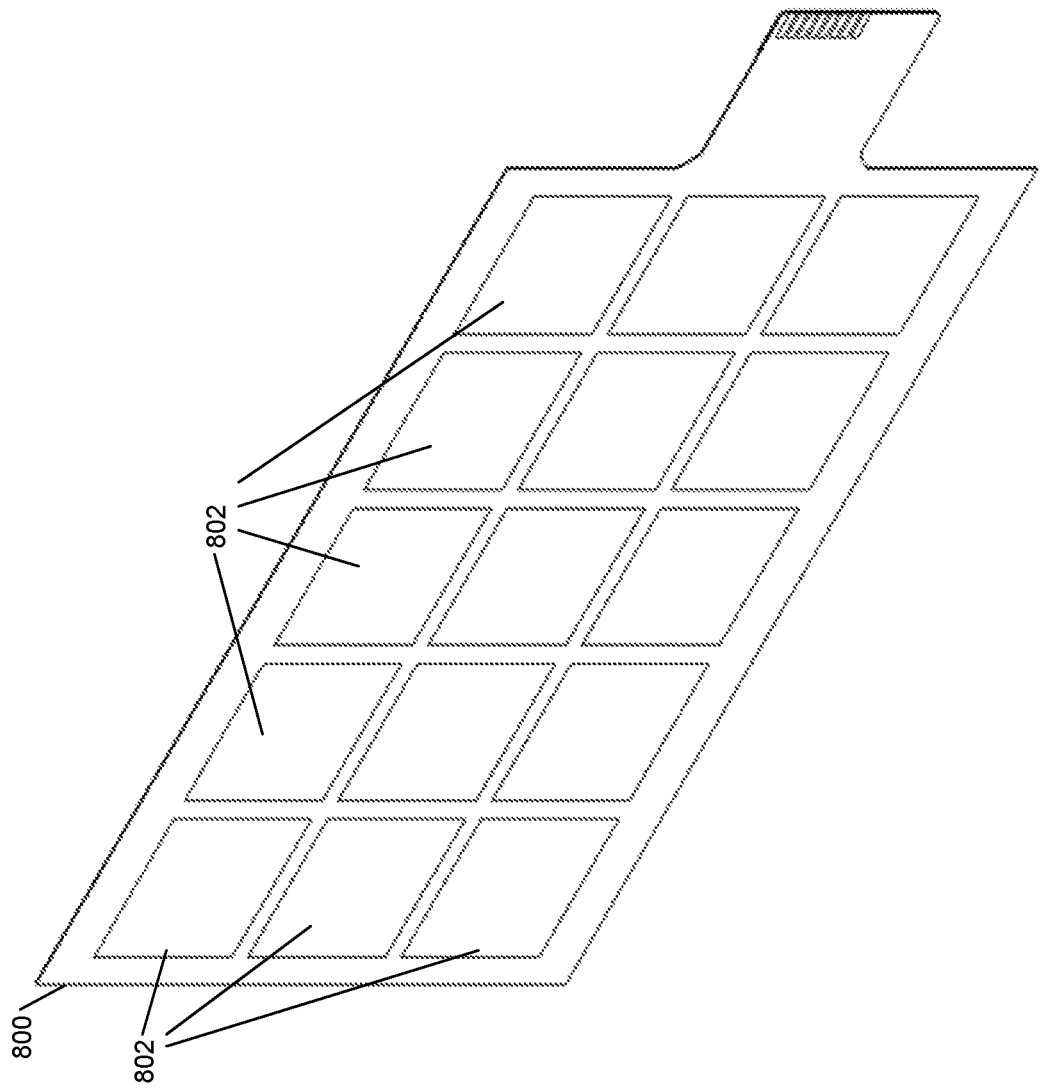
FIG. 19 is a perspective view of another capacitive keyboard including 15 sensing elements in accordance with an embodiment of the present disclosure.

The multi-layer capacitive keyboard 108 may include any number of capacitive sensing elements. FIGS. 6, 18 and 19 show some example implementations. The geometry of the capacitive sensing areas may be rectangular, round, polygonal shaped or include a mixed pattern placement of the stated shapes.

Figure 16:
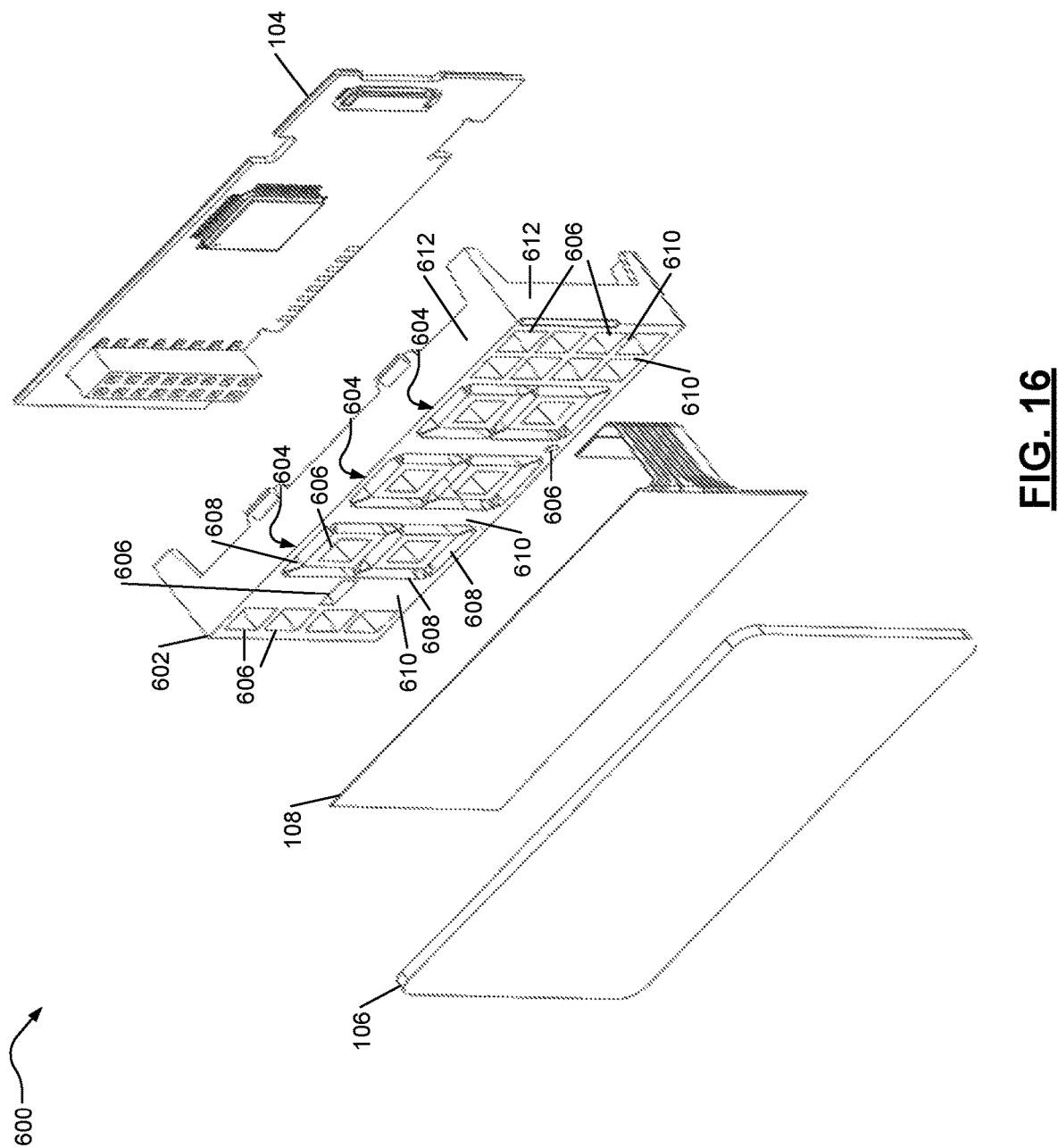
FIG. 16 is a perspective exploded view of another example of an interactive touch display assembly including a 7-segment display and a capacitive keyboard in accordance with an embodiment of the present disclosure.

The 7-segment display 110 may include the flat-transparent panel or front surface 121 and sides 122. In one embodiment, the flat-transparent panel is not included or is integrated with the sides 122 as a single component to provide the body of the 7-segment display as shown in FIG. 16. The body may be formed of plastic, plastic polymers, and/or other suitable materials. The multi-layer capacitive keyboard 108 may be applied to and superimposed on the flat-transparent panel or front surface 121. The 7-segment display 110 may include one or more 7-segment LED display devices, one or more 7-segment LCD devices and/or other LED or LCD devices. In one embodiment, the 7-segment display includes a series of multiple 7-segment devices (LED or LCD devices). Thus, although the 7-segment display 110 is referred to as a "7-segment display", the 7-segment display 110 may include more than 7 segments, which may be viewed by a user. During operation, various decorations, icons, segments, etc. of the multi-layer capacitive keyboard 108 and the 7-segment display 110 may be displayed and viewed from the front of the casing 106. Another example of a 7-segment display that may be used in replacement of the 7-segment display 110 is shown in FIG. 16.

The PCB 104 includes a substrate 130, one or more processors (e.g., one microprocessor 132 is shown), a ribbon connector 134, and a 7-segment display connector 136. Other chips and/or electronic circuit elements may be included on the PCB 104, such as one or more memory chips, one or more drivers, a power source and/or connector, etc. The 7-segment display devices may be directly soldered to the PCB 104, connected by single or multi-wire cables (e.g., flat wires) or via male/female insertion connectors, such as the 7-segment display connector 136. The drivers may be included in the one or more processors or may be separate from the one or more processors. The drivers may be used to drive the 7-segment display 110. As an example, the drivers may be used for switching ON the segments of the 7-segment display 110 and/or to illuminate icons. In one embodiment, one or more light guides in the light guide film layers are disposed above, on the side, below and/or on top of the 7-segment display devices and have the function of increasing luminous output towards the user and thus improving the user ability to visually see the items being displayed. The light guides may be used to direct, focus, or isolate light provided by the 7-segment display 110.

During operation, the processors: display information via a combination of the decorative film layers and/or the light guide layers of the capacitive keyboard 108 and the 7-segment display 110; and detect user inputs (e.g., gestures) via the capacitive keyboard 108. The processors receive commands from a user and control operation of the 7-segment display based on the commands. The processors may communicate with other devices within a network device. The processors are used for managing of the 7-segment display 110, providing notifications of operating states by displaying icons, and detecting and decoding interactions with a user, such as decoding of received gestures. In one embodiment, the 7-segment display 110 is used for displaying alphanumeric information and the icons are used for notification of the operating states.

Figure 3:
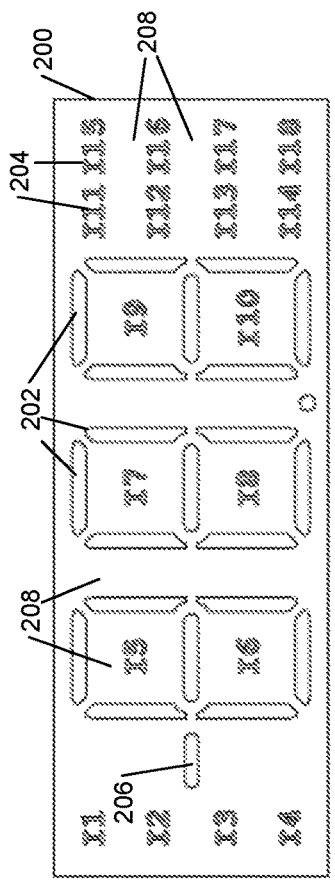
FIG. 3 a front view of one or more decoration film layers of the capacitive keyboard of FIG. 1.
Figure 4:
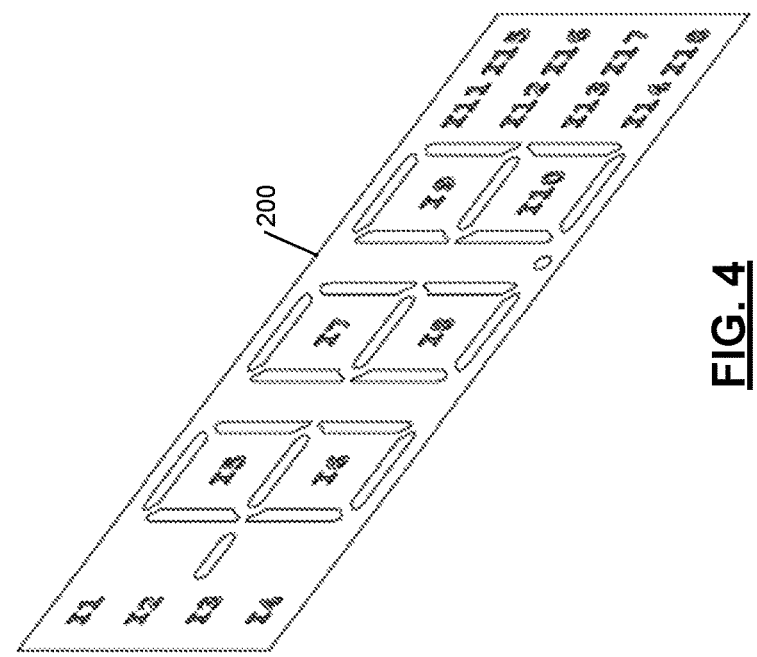
FIG. 4 a perspective view of the one or more decoration film layers of FIG. 3.

FIGS. 3-4 show one or more decoration film layers 200 of the capacitive keyboard 108 of FIGS. 1-2. The decoration film layers 200 include (i) light guides 202 for the segments of the 7-segment display, and (ii) icons 204. The decoration film layers 200 may include other light guides (or transparent windows), such as a light guide 206. The icons 204 may be in the form of light guides and used to indicate operating states. In the example shown, the icons include I1-I18 corresponding respectively to 18 or more operating states. In one embodiment, areas 208 between the light guides 202, 206 and the icons 204 may not be transparent and thus may not permit transmission of light provided by the 7-segment display 110 of FIG. 1.

Figure 5:
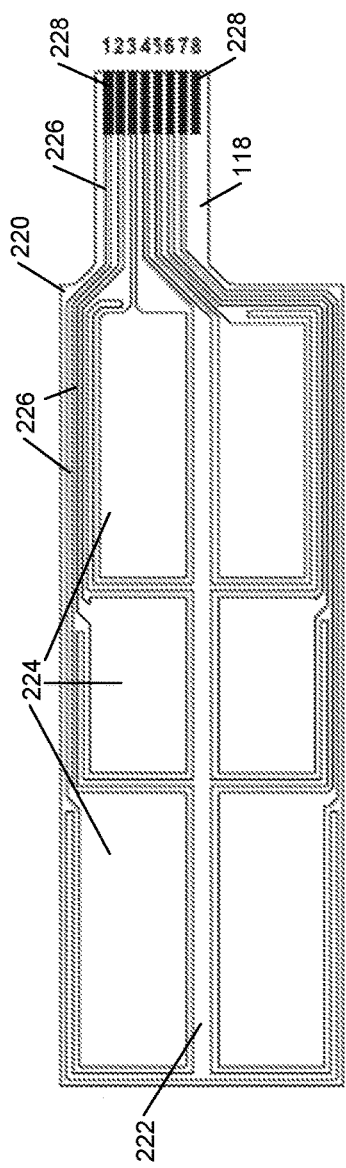
FIG. 5 a front view of a capacitive sensing layer of the capacitive keyboard of the 7-segment display of FIG. 1 including 6 sensing elements.

FIGS. 5-6 show a capacitive sensing layer (or keypad) 220 that includes a capacitive film layer 222 with sensing elements (referred to as capacitive keys or pads) 224 and traces (or tracks) 226. The traces 226 extend from the sensing elements 224 to the ribbon circuit 118 and are coupled to electrodes 228 at an end of the ribbon circuit 118. The sensing elements 224 have respective capacitive sensing surfaces (or conductive areas). Although shown as including 6 sensing elements 224, the capacitive sensing layer 220 may include any number of sensing elements. Pitches (or spacing between at least some of the traces 226) are used for interaction with an external object (e.g., a person's finger or a pen). The sensing elements 224 are used to detect interactions with the external object. Some examples of interactions are: a single touch on the surface 112 of the casing 106 of FIG. 1; multiple touches on the surface 112; horizontal sliding of a finger or pen across the surface 112; vertical sliding of a finger or a pen across the surface 112; and clockwise or anticlockwise rotation and/or circular movement of a finger or a pen on the surface 112.

The capacitive sensing layer 220 may include multiple layers and/or traces (or runways) arranged and geometrically shaped as defined by types and geometric shapes of the 7-segment display devices incorporated in the 7-segment display 110 of FIG. 1. The traces (e.g., the traces 226) are formed of a conductive material, such as a metallic material and/or other suitable material.

During operation, interaction of an object on the surface 112 of the casing 106 is identified via the capacitive sensing layer 220. As an example, one of the processors of the PCB 104 of FIG. 1 may analyze signals associated with the traces 226 to determine the command provided. The controller may detect changes in resistances of the sensing elements 224, changes in charges (or charge variation) of the sensing elements 224, voltage changes, etc. The processing of the variation of charge indicates the aforementioned interaction as belonging to one of a predetermined set of gestures, such as: a single touch in a predefined area of the surface 112; multiple touches in a same area of the surface 112; multiple touches in different areas of the surface 112; sliding, for example a finger or a pen, to the right on the surface 112; sliding, for example a finger or a pen, to the left on the surface 112; scrolling up (or sliding, for example a finger or a pen, up) the surface 112; scrolling down (or sliding, for example a finger or a pen, up) on the surface 112; rotating in a clockwise direction, for example a finger or a pen, on the surface 112; and rotating in a counterclockwise direction, for example a finger or a pen, on the surface 112.

Figure 7:
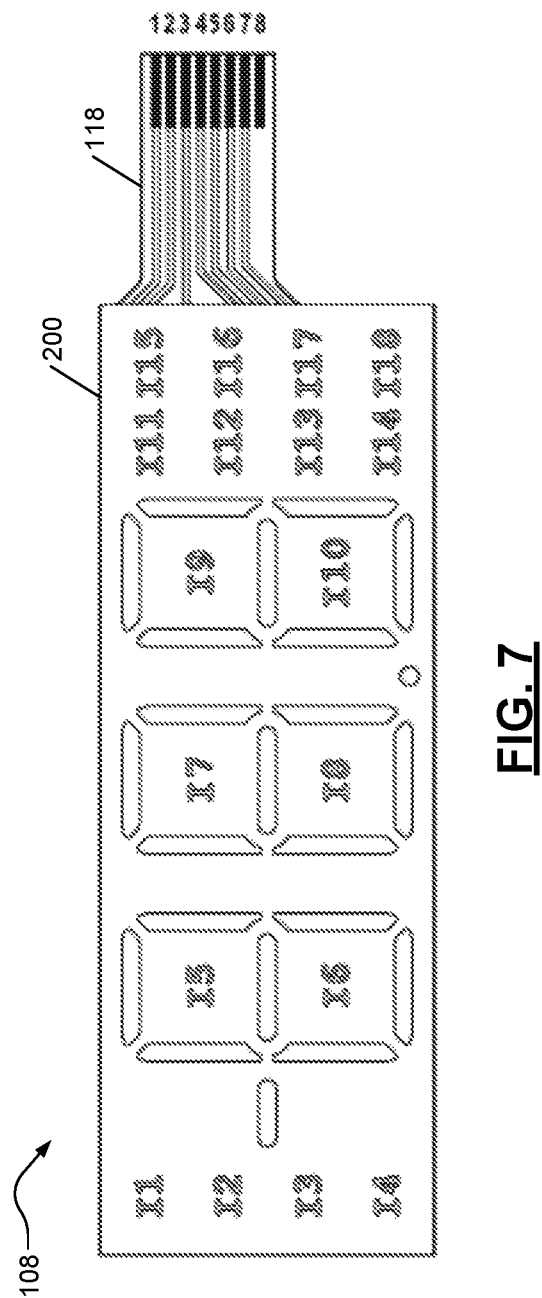
FIG. 7 is a front view of the capacitive keyboard of FIG. 1.

FIG. 7 shows the multi-layer capacitive keyboard 108 including the one or more decorative film layers 200 and the capacitive sensing layer 220 (although not shown in FIG. 7, the capacitive sensing layer 220 is shown in FIGS. 5-6). The capacitive sensing layer 220 is attached and/or integrally formed with the ribbon circuit 118. As shown, the decorative film layers 200 are applied on the capacitive sensing layer 220. The decorative film layers 200 may simply be disposed over and aligned with the capacitive sensing layer 220 or may be adhered to the capacitive sensing layer 220. The decorative film layers 200 may have a same surface area and shape as the capacitive sensing layer 220, which may match a surface area and/or shape of a front surface of the of the 7-segment display 110 of FIG. 1.

Modes of Operation

The user interface provided by the casing 106, the multi-layer capacitive keyboard 108 and the 7-segment display 110 of FIGS. 1-7 may have multiple modes of operation. The user interface may operate in a normal mode, where a value of interest is displayed in alphanumeric format on the 7-segment display 110. Notification and visualization of function icons is timed, as to not interfere with a user reading the value of interest displayed. The user interface may operate in a function activation mode, where only the notification and function icons are displayed. In the function activation mode, device functions may be activated by a simple touch pattern or a multi-touch pattern. The function activation mode may include splitting the corresponding viewing area into two or more screens having predefined views. While in an operating parameters modification mode, parameters may be set and/or modified. This may include changing alphanumeric values of the parameters for a corresponding network device. A predefined screen may be displayed for each parameter being changed.

During operation, when a network device is powered ON and/or the user interface is switched ON, the user interface switches by default to the normal operating mode. Interactivity begins as soon as a gesture, as described herein, is detected. Depending on the recognized gesture, the processors of the PCB 104 of FIGS. 1-2 may navigate the user interface to switch from operating in the normal mode to operating in a different mode. Various network device functions may be enabled via the operating modes.

Figure 8:
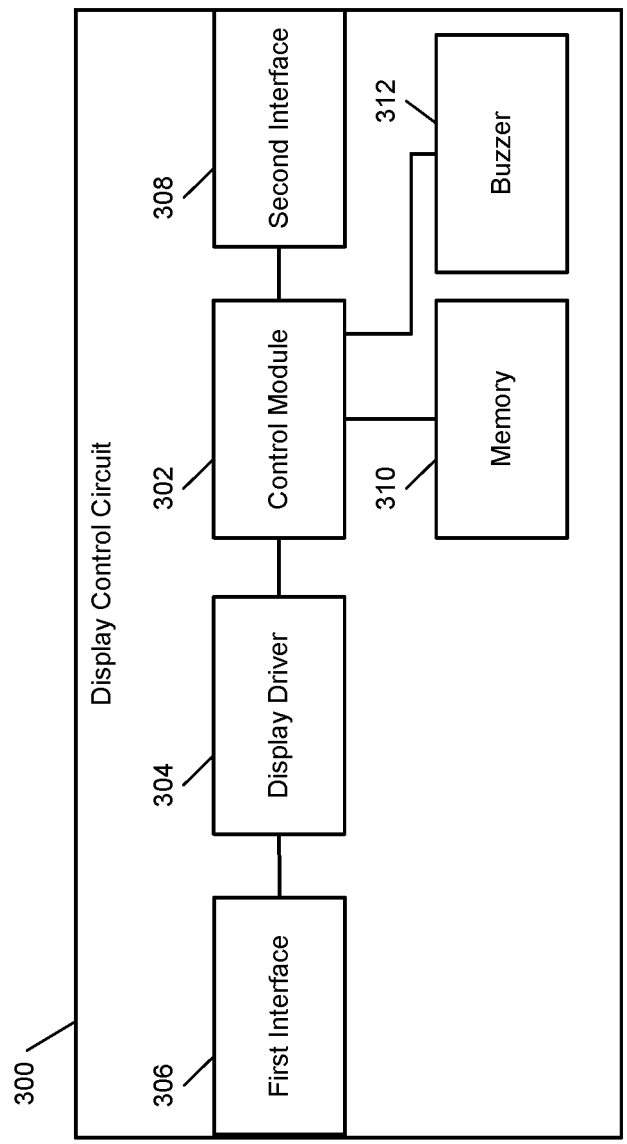
FIG. 8 is a functional block diagram of a display control circuit in accordance with an embodiment of the present disclosure.
Figure 15:
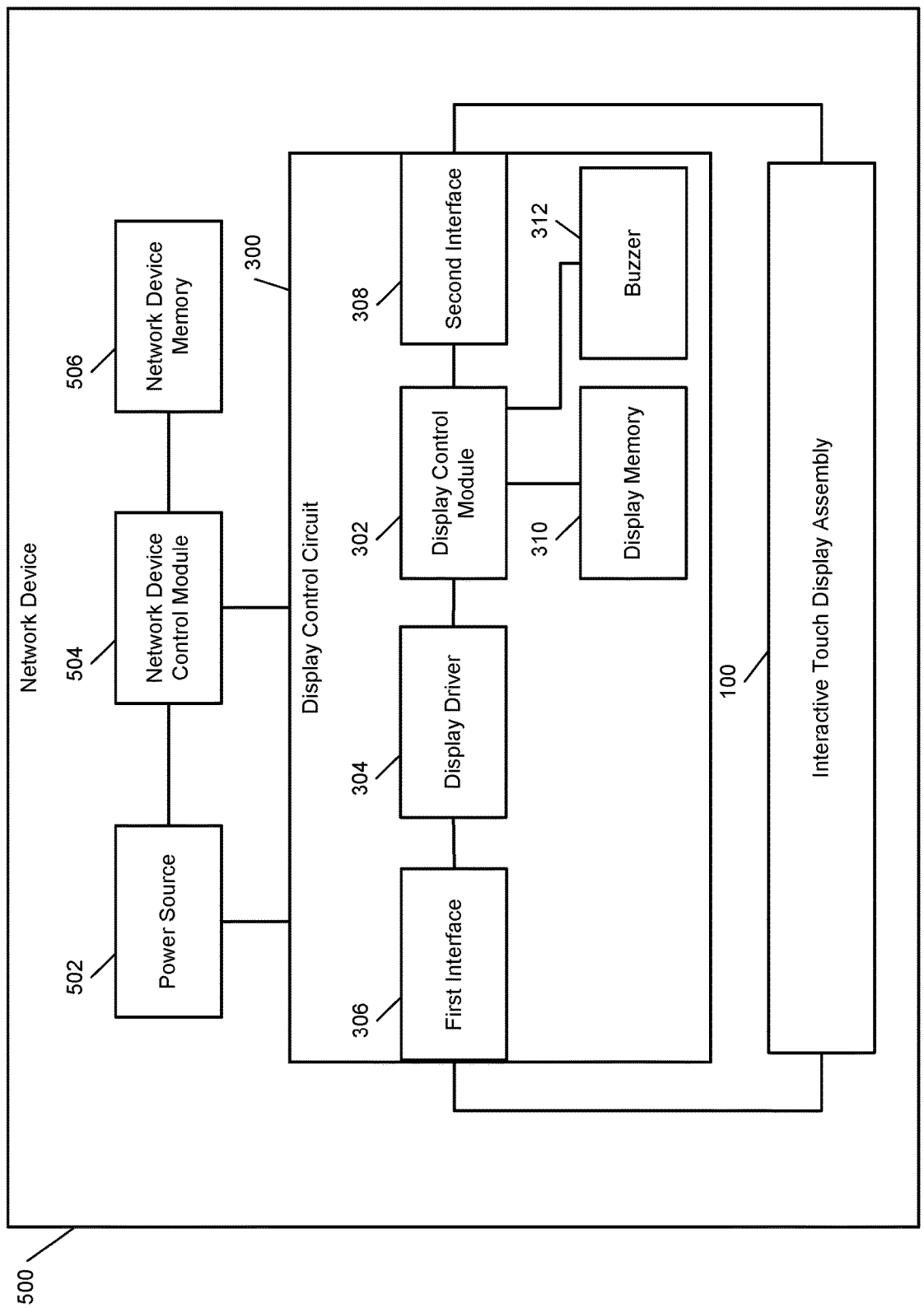
FIG. 15 is a function block diagram of a network device including the interactive touch display assembly of FIG. 1.

The PCB 104 of FIGS. 1-2 may include an audible buzzer, as shown in FIGS. 8 and 15. The buzzer (or speaker) may be attached to the PCB 104. The buzzer may be used to increase haptic perception during interaction between a user and the user interface. The use of the acoustic signals allows informing the user about: detection and correct decoding of gestures; an end of an operating mode; a transition between operating modes; a return to one of the operating modes, such as the normal operating mode; etc.

FIG. 8 shows an example of a display control circuit 300 that may be implemented on the PCB 104 of FIGS. 1-2. The display control circuit 300 may include one or more control modules 302 (e.g., one or more processors), a display driver 304, a first interface 306, and a second interface 308. The display control circuit 300 may include a memory 310 and/or a buzzer 312, such as that described above. The first interface 306 may include the connector 136 and connects to the 7-segment display 110. The control module 302 controls operation of the 7-segment display 110 via the display driver 304 and the first interface 306. The second interface 308 may include the connector 134, which connects to the multi-layer capacitive keyboard 108. The memory 310 may store tables, data and/or information relating the operating modes, the parameters, the operating states, the icons, the segments of the 7-segment display 110, gestures, etc.

Figure 9:
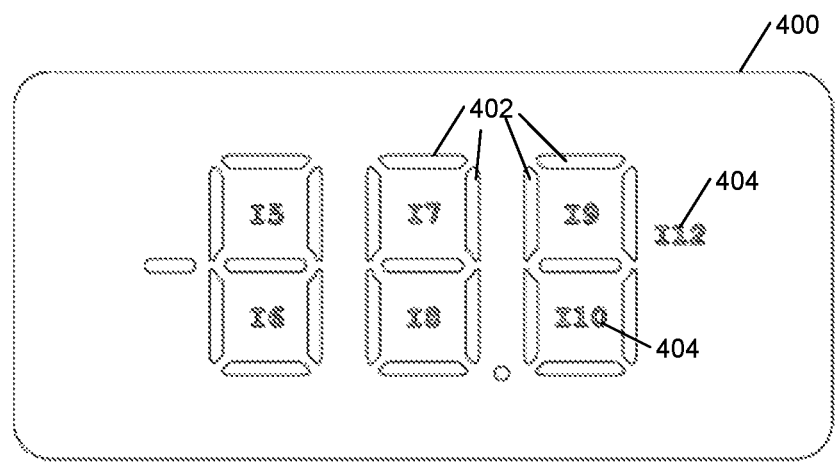
FIG. 9 is a front view of an example of a virtual screen illustrating segments and icons for normal and function activation modes in accordance with an embodiment of the present disclosure.

FIG. 9 shows an example virtual screen 400 of the interactive touch display assembly of FIG. 1 illustrating segments 402 and icons 404 that may be illuminated during the normal and function activation modes. As used herein, the term "screen" may refer to a subset of all segments and all function and notification icons displayed via the multi-layer capacitive keyboard 108 and the 7-segment display 110.

Figure 10:
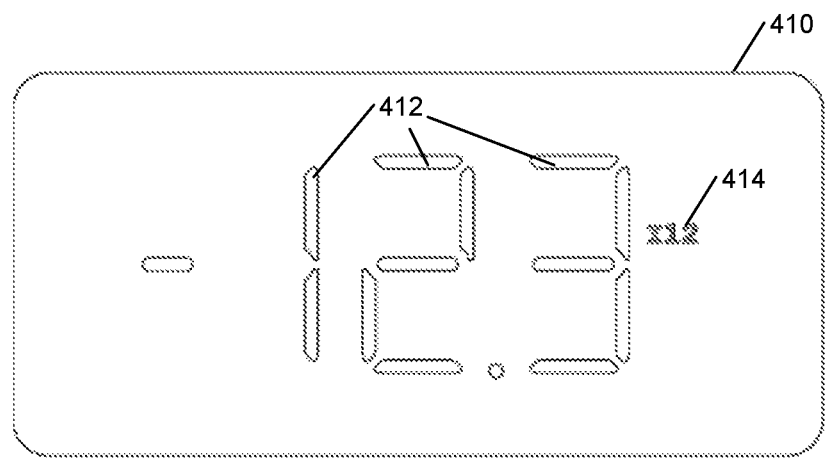
FIG. 10 is a front view of an example of a screen of the interactive touch display assembly of FIG. 1 while in the normal mode in accordance with an embodiment of the present disclosure.
Figure 11:
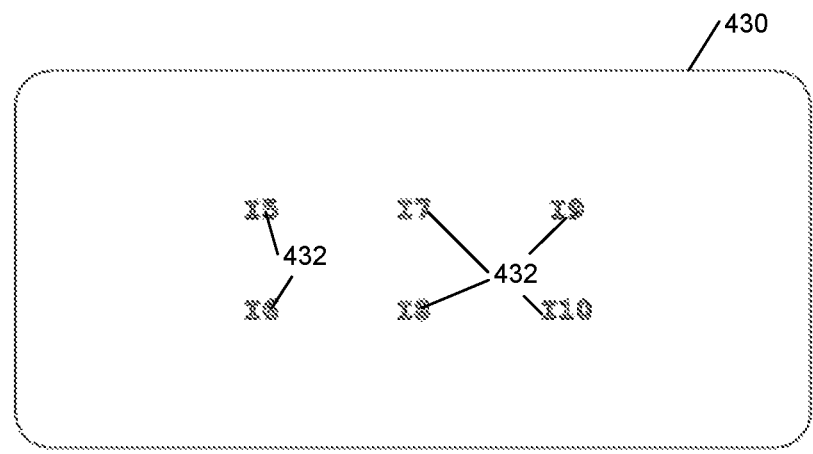
FIG. 11 is a front view of an example of a screen of the interactive touch display assembly of FIG. 1 while in the function activation mode in accordance with an embodiment of the present disclosure.

FIG. 10 shows an example of a screen 410 of the interactive touch display assembly 100 of FIG. 1 while in the normal mode. Example segments 412, an example icon 414, and other segments and/or display elements 416 are displayed. FIG. 11 shows an example of a screen 430 of the interactive touch display assembly 100 of FIG. 1 while in the function activation mode. An example set of icons 432 is displayed.

Figure 12:
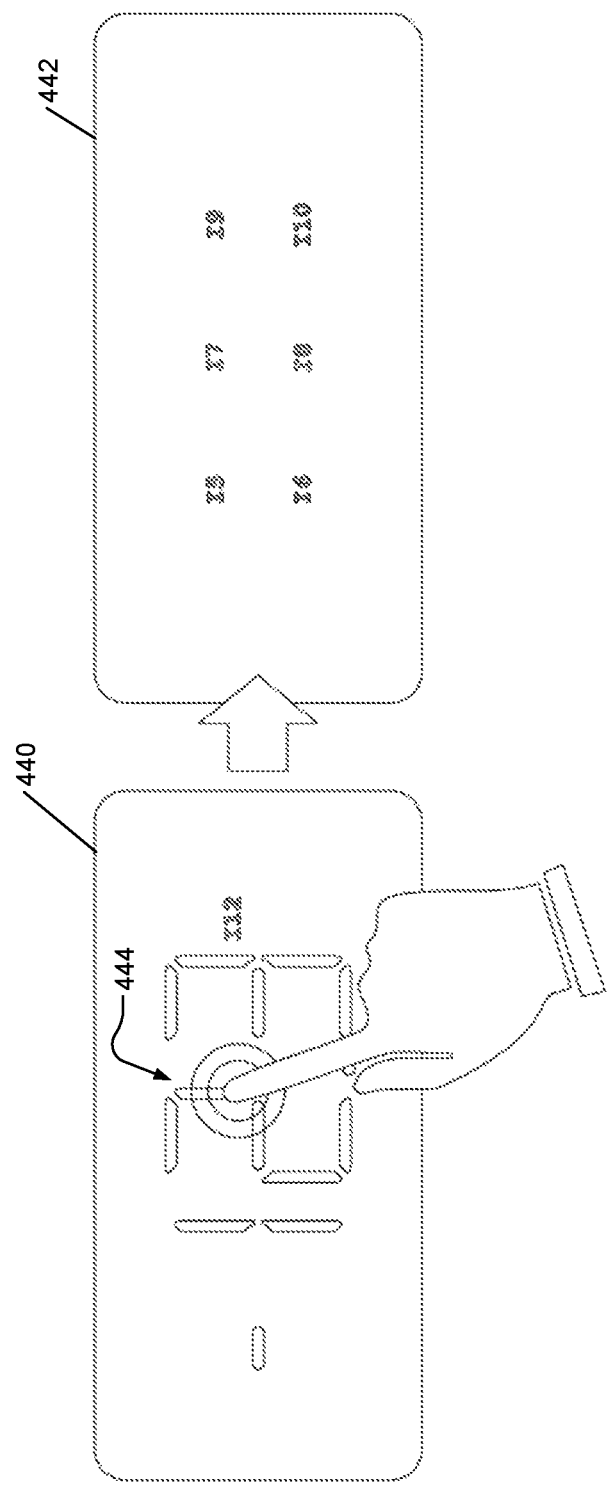
FIG. 12 illustrates an example of switching from a normal mode screen to a function activation mode screen based on a first type of gesture in accordance with an embodiment of the present disclosure.
Figure 13:
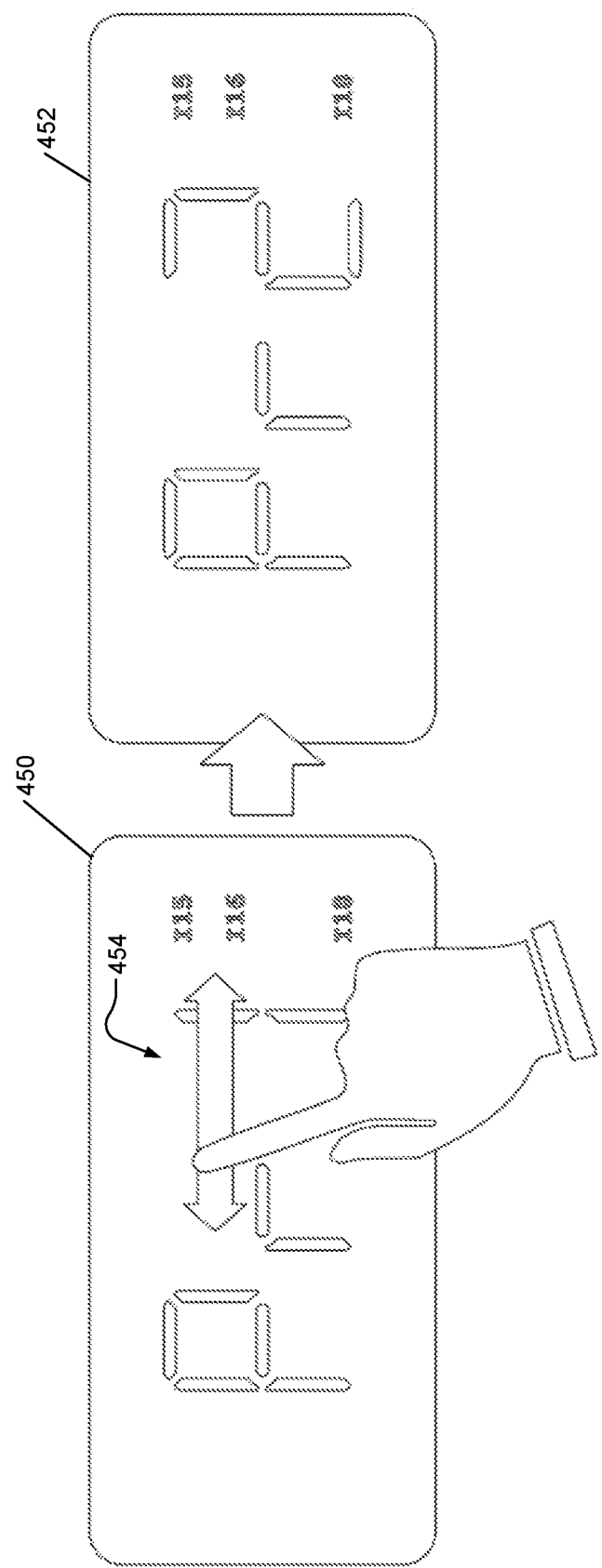
FIG. 13 illustrates an example of switching from a first navigation mode screen to a second navigation mode screen based on a second type of gesture in accordance with an embodiment of the present disclosure.
Figure 14:
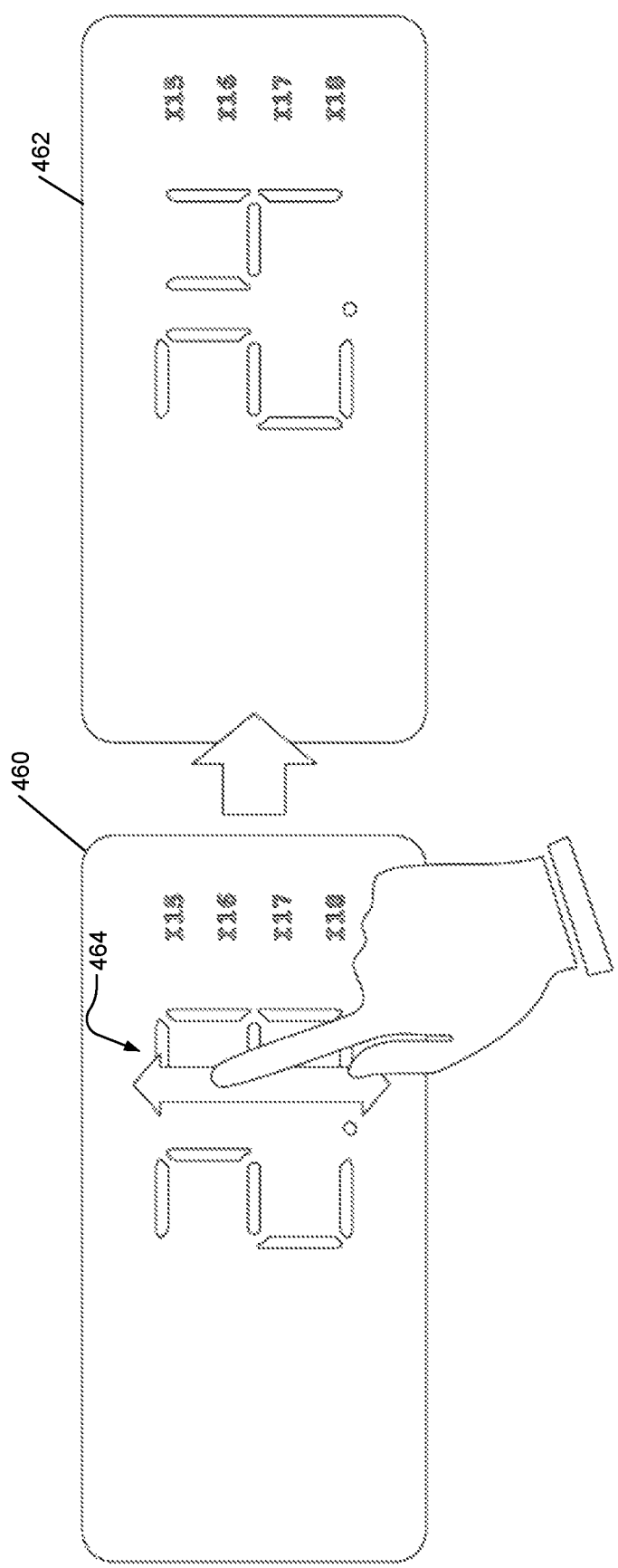
FIG. 14 illustrates an example of switching from a third navigation mode screen to a fourth navigation mode screen based on a second type of gesture in accordance with an embodiment of the present disclosure.

As described above, a user while interacting with the user interface may provide commands in the form of gestures. Example gestures include vertically scrolling in an upward direction; defined as mimicking the tracing of one or more lines with one or more fingers or other objects in an upward direction on the surface 112. The tracing may start from a bottom of the user interface surface 112 and reach an upper limit of the user interface surface 112. The gestures may further include vertically scrolling in a downward direction; defined as mimicking the tracing of one or more lines with one or more fingers or other objects in a downward direction on the surface 112. This may start from a top of the user interface surface 112 and reach a lower limit of the user interface surface 112. The gestures may further include horizontal scrolling; defined as mimicking the tracing of one or more lines with one or more fingers or other objects in a horizontal or lateral direction across the user interface surface 112. This may start from one of the horizontal borders of the user interface surface 112 and end at an opposite horizontal border of the user interface surface 112. For example, the tracing of a line from the left side of the user interface surface to the right side of the user interface surface. A gesture may include a single touch in a non-localized area of (or anywhere on) the user interface surface 112. A gesture may include multiple touches in non-localized areas of the user interface. FIGS. 12-14 show examples for three of the stated gestures.

FIG. 12 shows an example of switching from a normal mode screen 440 to a function activation mode screen 442 based on a first type of gesture 444 (a single touch in a center of the user interface surface 112). FIG. 13 shows an example of switching from a first navigation mode screen 450 to a second navigation mode screen 452 based on a second type of gesture 454 (a horizontal swipe). FIG. 14 shows an example of switching from a third navigation mode screen 460 to a fourth navigation mode screen 462 based on a third type of gesture (a vertical swipe) 464.

FIG. 15 is a function block diagram of a network device 500 including the interactive touch display assembly 100 of FIG. 1 and the display control circuit 300 of FIG. 8. The network device 500 may include a power source 502, a network device control module 504, network device memory 506, the display control circuit 300 and the interactive touch display assembly 100. The display control circuit 300 may include the control module (or display control module) 302, the display driver 304, the first interface 306, the second interface 308, the memory (or display memory) 310 and the buzzer 312.

FIG. 16 shows an interactive touch display assembly 600 that is similar to the interactive touch display assembly 100 of FIG. 1, but includes a 7-segment display 602 as shown as well as the casing 106, the capacitive keyboard 108 and the PCB 104. The 7-segment display 602 includes 7-segment display devices (or portions) 604, and other light emitting portions (or illuminous areas) 606, which may be used to illuminate the above-described icons. The 7-segment display devices each include 7 light-emitting segments (or illuminous areas) 608. Each of the light emitting segments 608 and each of the light emitting portions 606 may have a respective light-emitting device (e.g., LED). Each of the light emitting portions 606 and the light emitting segments 608 may corresponding to a transparent window, light guide, and/or icon of the decoration film layer(s) of the capacitive keyboard 108. Non-illuminating areas corresponding to structural dividing members 610 are disposed between the illuminous areas 606, 608 and along with the sides 612 provide the body of the 7-segment display 602.

Figure 17A:
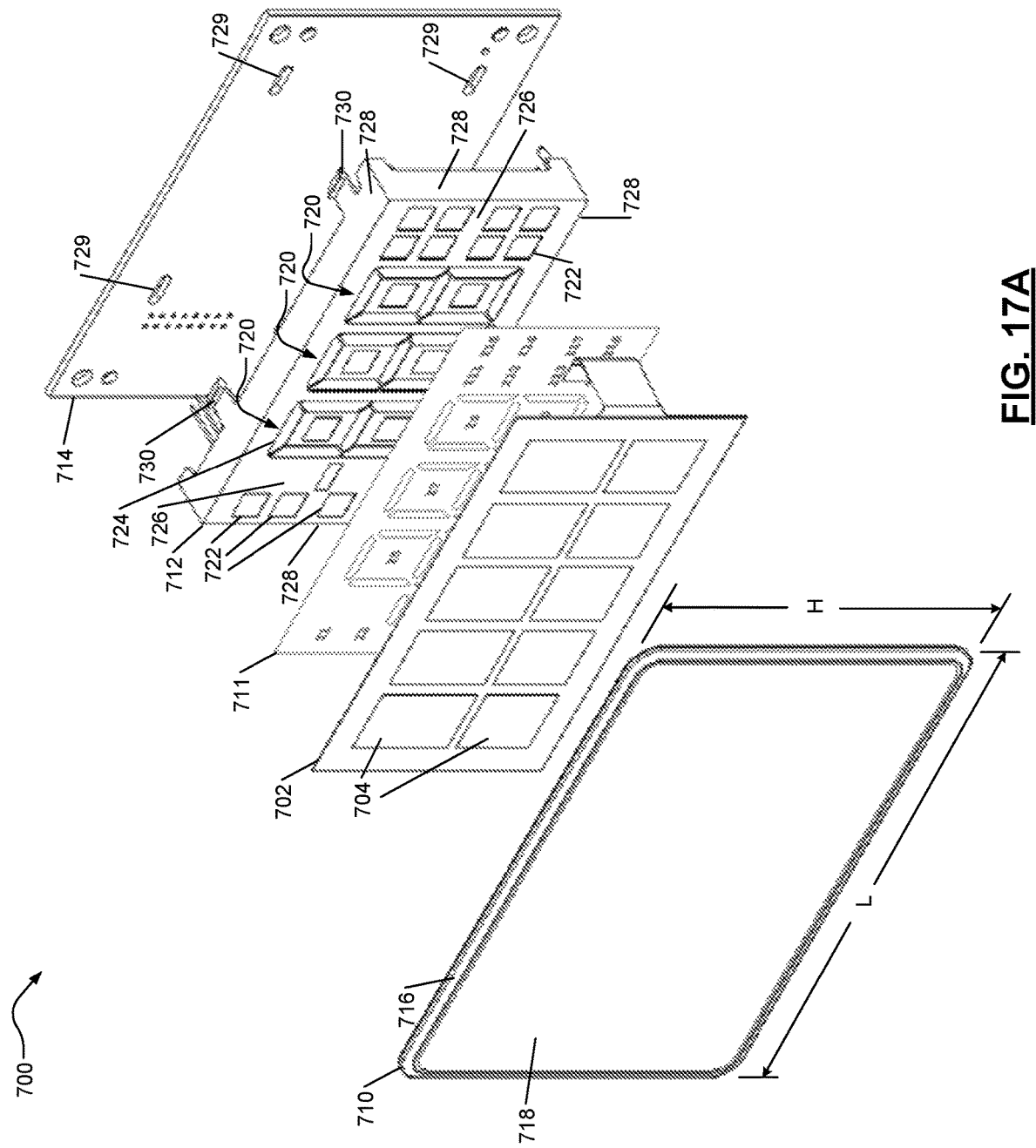
FIG. 17A is a front perspective exploded view of another example of an interactive touch display assembly including a capacitive keyboard with 10 sensing elements and a 7-segment display and a capacitive keyboard in accordance with an embodiment of the present disclosure.
Figure 17B:
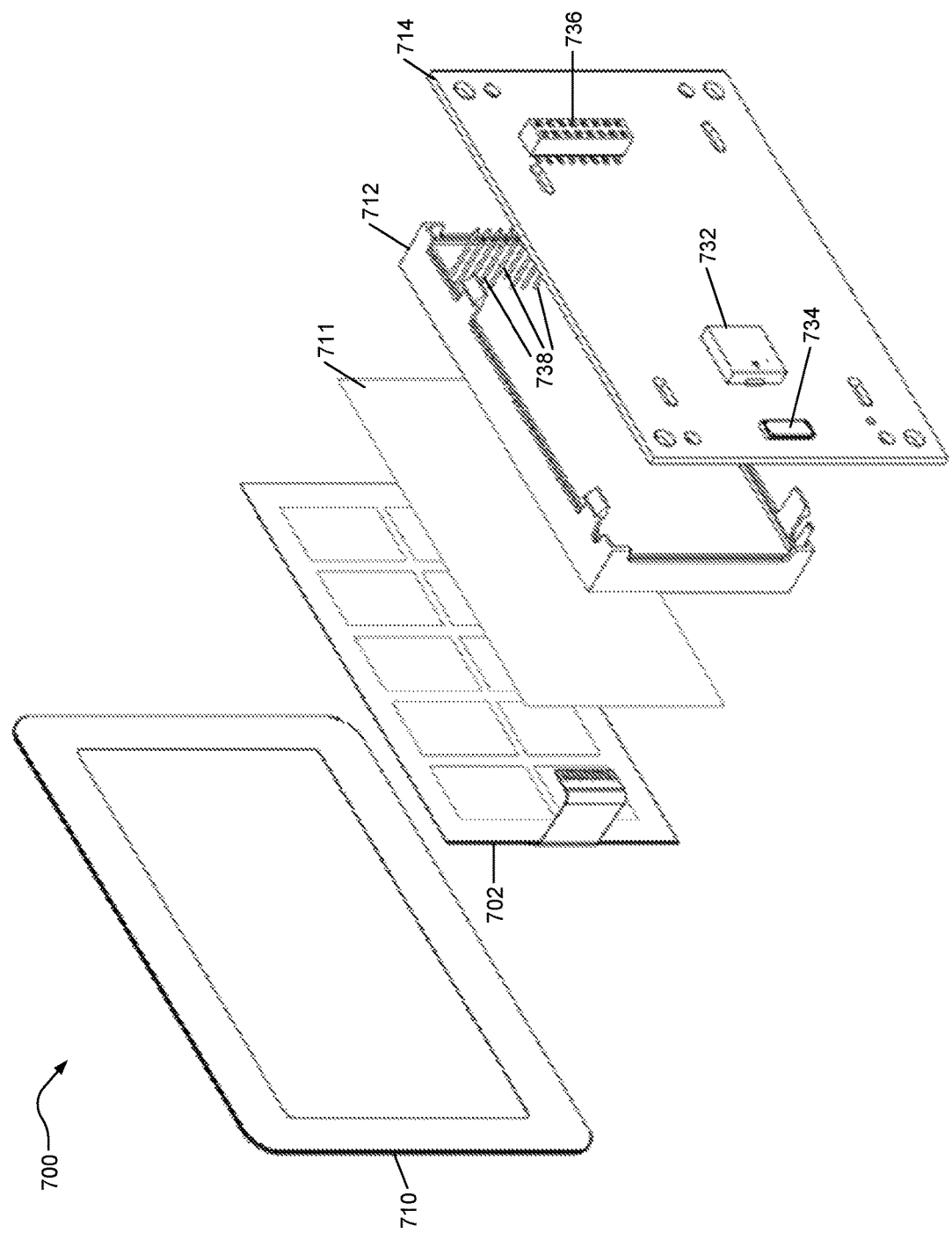
FIG. 17B is a rear perspective exploded view of the interactive touch display assembly of FIG. 17A.

FIGS. 17A and 17B show an interactive touch display assembly 700 that is similar to the interactive touch display assembly 100 of FIG. 1 and the interactive touch display assembly 600 of FIG. 16. The interactive touch display assembly may operate similar manner as the assemblies 100, 600. The interactive touch display assembly 700 has a capacitive keyboard 702 that includes 10 sensing elements 704 instead of 6 as does the multi-layer capacitive keyboard 220 of FIGS. 5-6. The interactive touch display assembly 700 also includes a casing 710, a decorative film layer 711, a 7-segment display 712 and a PCB 714. The casing 710 may include a non-transparent frame 716 and an inner transparent surface 718. The capacitive keyboard 702 may be disposed in the casing 710 and include one or more layers. In the example shown the capacitive keyboard 702 includes a capacitive sensing layer having the sensing elements 704. The decorative film layer 711 is similar to the decorative film layer 200 of FIGS. 3-4 and 7. Although the decorative film layer 711 is shown as being disposed between the capacitive keyboard 702 and the 7-segment display 712, the decorative film layer 711 may be disposed between the casing 710 and the capacitive keyboard 702.

The 7-segment display 712 includes 7-segment display devices (or portions) 720, and other light emitting portions (or illuminous areas) 722, which may be used to illuminate the above-described icons. The 7-segment display devices 720 each include 7 light-emitting segments (or illuminous areas) 724. Each of the light emitting segments 724 and each of the light emitting portions 722 may have a respective light-emitting device (e.g., LED). Each of the light emitting portions 722 and the light emitting segments 724 may corresponding to a transparent window, light guide, and/or icon of the decoration film layer 711 and/or one of the layers of the capacitive keyboard 702. Non-illuminating areas corresponding to structural dividing members 726 are disposed between the illuminous areas 722, 724 and along with the sides 728 provide the body of the 7-segment display 712. The 7-segment display 712 clips into respective holes 729 in the PCB 714 via tabs 730. Components are mounted on the rear side (or underside) of the PCB 714 and may include, for example, a microprocessor 732 and a ribbon connector 734 for the connector on the ribbon of the capacitive keyboard 702. The components may also include a connector 736 for pins 738 of the 7-segment display 712. As with the other PCBs disclosed herein, components may be mounted on both front and rear sides of the PCB 714.

FIG. 18 shows another capacitive keyboard 752, which includes 12 sensing elements 754. The capacitive keyboard 752 may replace one or more of the other capacitive keyboards disclosed herein. The capacitive keyboard 752 may include one or more layers, a ribbon circuit with traces and a connector, as similarly described above with the capacitive keyboards 108, 220 of FIGS. 1 and 4. FIG. 19 shows a capacitive keyboard 800 that includes 15 sensing elements 802. The capacitive keyboard 802 may include one or more layers, a ribbon circuit with traces and a connector, as similarly described above with the capacitive keyboards 108, 220 of FIGS. 1 and 4. As the number of sensing elements is increased, the size of the sensing elements may decrease for a same overall sized capacitive keyboard. The overall sizes of the capacitive keyboards disclosed herein may be increased or decreased, depending on the application. For example and as shown in FIG. 17A, the overall length L and height H dimensions of the capacitive keyboard may be 72 millimeters (mm)×114 mm, 32 mm×74 mm, or have some other overall length and height dimensions.

FIG. 20 shows an example stack 900 of layers that includes decorative film layers 904, light guide layers 906 and a capacitive sensing layer 908. This is one example, numerous other stacked arrangements may be implemented. Any number of decorative film layers, light guide layers and capacitive sensing layers may be included in the stack. Also, although a particular order of the decorative film layers, light guide layers and capacitive sensing layer is shown, the order of the layers may be different. In an embodiment, the decorative film layers and the light guide layers alternate, such that a decorative film layer may be disposed between two light guide layers and/or a light guide layer may be disposed between the decorative film layers. In another embodiment, more than one capacitive film layer is included and at least one of the capacitive film layers is not the bottom layer in the stack. A capacitive film layer may be disposed between: two decorative film layers; two light guide layers; one decorative film layer and one light guide layer; one decorative film layer and another capacitive film layer; and one light guide layer and another capacitive film layer. Interlocking portions 910 of two of the layers 904, 906 are shown for example purposes. In an embodiment, adhesive layers are disposed between adjacent ones of the layers 904, 906 and 908. In other embodiments, the layers 904, 906, 908 interlock using: double-sided adhesive tape disposed between adjacent ones of the layers 904, 906, 908; mechanical coupling; welded joints; and/or other interlocking techniques. Similar methods may also be used to interlocking the layers 904, 906 to a casing, such as the casing 710 of FIG. 17A.

The above-described examples include classifying interactions based on gestures, where the gestures are associated with a technique of using network devices with 7-segment displays. The traditional concept of physical/mechanical buttons associated with one or more functions is replaced by a concept of logical buttons with functions determined by the screen of use (interactivity).

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" refers to or includes: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP:

Hypertext Preprocessor), Scala, Eiffel, Smalltalk, Erlang, Ruby, Flash®, Visual Basic®, Lua, MATLAB, SIMULINK, and Python®.

What is claimed is:

1. An interactive touch display assembly comprising:
a circuit board comprising a first control module; and
a user interface comprising
   a 7-segment display connected to the circuit board and including a 7-segment light emitting diode (LED) display with (i) discrete LEDs configured to illuminate respective segments of the 7-segment LED display, and (ii) structural dividing members defining seven light guides directing light emitted respectively from the discrete LEDs, and
   a first capacitive keyboard overlaid on at least a portion of the seven light guides of the 7-segment display and comprising a capacitive sensing layer having capacitive sensing elements, wherein states of the capacitive sensing elements change based on gestures provided by a user of the interactive touch display assembly across the capacitive sensing elements and the corresponding portion of the 7-segment display below the capacitive sensing elements,
wherein
   each of the gestures occurs over the portion of the 7-segment display being changed as a result of that gesture,
   at least one of the gestures occurs over the portion of the 7-segment display being changed and over one or more areas between segments of the 7-segment display,
   the first control module is configured to
      control operation of the 7-segment display based on detected changes in the states of the capacitive sensing elements, and
      in response to the at least one of the gestures, switch from a first navigation mode screen indicated on the 7-segment display to a second navigation mode screen indicated on the 7-segment display,
   the first control module is configured to, in response to a first gesture, operate in a first mode to display a screen including only notification and function icons displayed and located in at least one of (i) areas between the segments of the 7-segment display, or (ii) areas outside the segments of the 7-segment display; and
   one of the capacitive sensing elements over one of the notification and function icons is allocated to a first function while operating in the first mode and is allocated to a second function while the first control module is operating in a second mode.

2. The interactive touch display assembly of claim 1, wherein the 7-segment display includes 7-segment LED devices.

3. The interactive touch display assembly of claim 1, further comprising a second capacitive keyboard overlaid on a second portion of the 7-segment display.

4. The interactive touch display assembly of claim 1, wherein:
the first capacitive keyboard comprises one or more decoration film layers or light guide layers; and
the one or more decoration film layers or light guide layers are overlaid on the capacitive sensing layer.

5. The interactive touch display assembly of claim 1, wherein the first capacitive keyboard covers some of the 7-segment display.

6. The interactive touch display assembly of claim 1, wherein the first capacitive keyboard covers all the 7-segment display.

7. The interactive touch display assembly of claim 1, wherein an entire interactive area of the user interface is a same amount of area that the first capacitive keyboard covers on the 7-segment display.

8. The interactive touch display assembly of claim 1, wherein the first control module is configured to classify interactions with the user based on the gestures detected via the first capacitive keyboard.

9. The interactive touch display assembly of claim 1, wherein:
the 7-segment display and the first capacitive keyboard are configured to display a plurality of screens; and
each of the plurality of screens corresponds to a respective one or more functions performed by the interactive touch display assembly.

10. The interactive touch display assembly of claim 9, wherein each of the plurality of screens includes displaying a subset of available segments and a subset of available icons.

11. The interactive touch display assembly of claim 10, wherein the icons are located between segments of the 7-segment display.

12. The interactive touch display assembly of claim 1, wherein the first capacitive keyboard includes light guides for guiding light generated by the 7-segment display.

13. The interactive touch display assembly of claim 1, wherein the capacitive sensing elements of the first capacitive keyboard (i) are not associated with dedicated predefined functions, and (ii) are not dedicated as an input for one or more particular predefined functions.

14. The interactive touch display assembly of claim 13, wherein each of the capacitive sensing elements is used for a plurality of functions.

15. The interactive touch display assembly of claim 1, wherein the gestures include:
a single touch in any area of a surface of the user interface;
multiple touches in different areas of the surface of the user interface;
a horizontal swipe on the surface of the user interface;
a vertical swipe on the surface of the user interface;
a clockwise rotational swipe on the surface of the user interface; and
a counterclockwise rotational swipe on the surface of the user interface.

16. The interactive touch display assembly of claim 1, wherein:
the first capacitive keyboard covers the 7-segment display and comprises a plurality of layers;
at least a portion of each of the plurality of layers is transparent; and
segments illuminated on the 7-segment display are visible through the first capacitive keyboard.

17. The interactive touch display assembly of claim 1, further comprising a casing or a container, wherein the first capacitive keyboard is attached to an inner side of the casing or the container.

18. The interactive touch display assembly of claim 17, wherein a front surface of the casing or the container is transparent.

19. The interactive touch display assembly of claim 1, wherein:
the 7-segment display is configured to connect to the circuit board via a first connector;

the first capacitive keyboard comprises a ribbon circuit; and the ribbon circuit is configured to connect to the circuit board via a second connector.

20. The interactive touch display assembly of claim 1, wherein:

the first capacitive keyboard comprises a decoration film layer;

the decoration film layer comprises a plurality of light guides;

the 7-segment display is configured to light-up selected ones of the plurality of light guides to display a predetermined set of segments and one or more icons; and the predetermined set of segments includes one or more segments.

21. A network device comprising:

the interactive touch display assembly of claim 1;

a second control module connected to the first control module; and a power source configured to provide power to the first control module and the second control module.

22. The interactive touch display assembly of claim 1, wherein each of the gestures occurs over segments of the 7-segment display being changed as a result of that gesture.

23. An interactive touch display assembly comprising:

a circuit board comprising a control module; and a user interface comprising a 7-segment display connected to the circuit board and comprising a plurality of 7-segment light emitting diode (LED) display portions each of which comprising discrete LEDs and structural dividing members defining seven light guides directing light emitted respectively from the discrete LEDs, and a capacitive keyboard overlaid on at least a portion of the 7-segment display covering at least a portion of the seven light guides of each of the plurality of 7-segment LED display portions and comprising a capacitive sensing layer having capacitive sensing elements, wherein states of the capacitive sensing elements change based on gestures provided by a user of the interactive touch display assembly across the capacitive sensing elements and the corresponding portion of the 7-segment display below the capacitive sensing elements, wherein the seven light guides of each of the plurality of 7-segment LED display portions are configured to guide light from corresponding LEDs towards the capacitive keyboard, each of the gestures occurs over the portion of the 7-segment display being changed as a result of that gesture, the control module is configured to control operation of the 7-segment display based on detected changes in the states of the capacitive sensing elements, the control module is configured to, in response to a first gesture, operate in a first mode to display a screen including only notification and function icons displayed and located in at least one of (i) areas between the segments of the 7-segment display, or (ii) areas outside the segments of the 7-segment display; and one of the capacitive sensing elements over one of the notification and function icons is allocated to a first function while operating in the first mode and is allocated to a second function while the control module is operating in a second mode.

24. The interactive touch display assembly of claim 23, wherein:

at least one of the gestures occurs over the portion of the 7-segment display being changed; and the control module is configured to, in response to the at least one of the gestures, switch from a first navigation mode screen indicated on the 7-segment display to a second navigation mode screen indicated on the 7-segment display.

25. The interactive touch display assembly of claim 24, wherein the at least one of the gestures occurs over one or more areas outside of segments of the 7-segment display being changed.

26. The interactive touch display assembly of claim 23, wherein the capacitive sensing elements are disposed over the seven light guides of the plurality of 7-segment LED display portions.

27. The interactive touch display assembly of claim 23, further comprising a film layer disposed between the 7-segment display and the capacitive keyboard, wherein the structural dividing members further define light guides for guiding light from additional LEDs to illuminate icons of the film layer.

28. The interactive touch display assembly of claim 27, wherein the light guides, guiding light from the additional LEDs, are disposed between the light guides of the discrete LEDs.

29. The interactive touch display assembly of claim 27, wherein one or more of the light guides, guiding light from the additional LEDs, is disposed between two of the light guides of one of the plurality of 7-segment LED display portions.

30. The interactive touch display assembly of claim 27, wherein the light guides, guiding light from the additional LEDs, are disposed outside of the plurality of 7-segment LED display portions.

31. An interactive touch display assembly comprising:

a circuit board comprising a control module; and a user interface comprising a 7-segment display connected to the circuit board, and a capacitive keyboard overlaid on at least a portion of the 7-segment display and comprising a capacitive sensing layer having capacitive sensing elements, wherein states of the capacitive sensing elements change based on gestures provided by a user of the interactive touch display assembly across the capacitive sensing elements and the corresponding portion of the 7-segment display below the capacitive sensing elements, wherein each of the gestures occurs over the portion of the 7-segment display being changed as a result of that gesture, at least one of the gestures occurs over the portion of the 7-segment display being changed and over one or more areas between segments of the 7-segment display, the control module is configured to (i) control operation of the 7-segment display based on detected changes in the states of the capacitive sensing elements, and (ii) in response to the at least one of the gestures, switch from a first navigation mode screen indicated on the 7-segment display to a second navigation mode screen indicated on the 7-segment display, the capacitive keyboard is configured to receive a first gesture, the control module is configured to, in response to the first gesture, operate in a first mode to display a first screen including a value displayed on the 7-segment display, the capacitive keyboard is configured to receive a second gesture, the control module is configured to, in response to the second gesture, operate in a second mode to display a second screen including only first one or more notification and function icons displayed and located in at least one of (i) areas between the segments of the 7-segment display, or (ii) areas outside the segments of the 7-segment display; and second one or more notification and function icons are displayed while the control module is operating in a third mode.

32. The interactive touch display assembly of claim 31, wherein at least one of the first one or more notification and function icons or the second one or more notification and function icons are located between the segments of the 7-segment display.

33. The interactive touch display assembly of claim 31, wherein:

the first gesture is a different type of gesture than the second gesture; and the first gesture is over a same portion of the 7-segment display as the second gesture.

* * * * *